(12) United States Patent
Suzuki et al.

(10) Patent No.: US 12,520,467 B2
(45) Date of Patent: Jan. 6, 2026

(54) REEL INSTALLATION AND REMOVAL DEVICE AND FEEDER PREPARATION SYSTEM

(71) Applicant: FUJI CORPORATION, Chiryu (JP)

(72) Inventors: Daiki Suzuki, Toyokawa (JP); Masataka Iwasaki, Anjo (JP)

(73) Assignee: FUJI CORPORATION, Chiryu (JP)

( * ) Notice: Subject to any disclaimer, the term of this patent is extended or adjusted under 35 U.S.C. 154(b) by 610 days.

(21) Appl. No.: 17/906,311

(22) PCT Filed: Mar. 18, 2020

(86) PCT No.: PCT/JP2020/012069
§ 371 (c)(1),
(2) Date: Sep. 14, 2022

(87) PCT Pub. No.: WO2021/186632
PCT Pub. Date: Sep. 23, 2021

(65) Prior Publication Data
US 2023/0089639 A1     Mar. 23, 2023

(51) Int. Cl.
| | |
|---|---|
| B29C 65/00 | (2006.01) |
| B65H 19/12 | (2006.01) |
| B65H 19/18 | (2006.01) |
| B65H 19/20 | (2006.01) |
| H05K 13/02 | (2006.01) |
| H05K 13/04 | (2006.01) |
| B29C 65/50 | (2006.01) |
| B29C 65/72 | (2006.01) |

(Continued)

(52) U.S. Cl.
CPC ......... *H05K 13/0417* (2013.01); *B65H 19/12* (2013.01); *B65H 19/1842* (2013.01); *B65H 19/20* (2013.01); *H05K 13/02* (2013.01); *B29C 65/50* (2013.01); *B29C 65/72* (2013.01); *B29C 65/74* (2013.01); *B29C 65/7894* (2013.01); *B29C 66/0326* (2013.01); *B65H 2301/4631* (2013.01)

(58) Field of Classification Search
CPC ......... B29C 65/50; B29C 65/72; B29C 65/74; B29C 65/7894; B29C 66/0326
See application file for complete search history.

(56) References Cited

FOREIGN PATENT DOCUMENTS

| | | |
|---|---|---|
| EP | 3 742 878 A1 | 11/2020 |
| JP | 5-175686 A | 7/1993 |

(Continued)

OTHER PUBLICATIONS

International Search Report Issued May 26, 2020, in PCT/JP2020/012069, filed on Mar. 18, 2020, 2 pages.

*Primary Examiner* — Philip C Tucker
*Assistant Examiner* — Nickolas R Harm
(74) *Attorney, Agent, or Firm* — Oblon, McClelland, Maier & Neustadt, L.L.P.

(57) ABSTRACT

A reel installation and removal device that installs and removes a reel on which a tape containing components is wound, the device including a control device configured to execute a detachment control of driving a holding section and a cutting section so that the tape is held and cut in a portion to which the component has been supplied after driving a feeding section and a rotation section so that the tape is rewound and wound around the reel, and controlling the feeder set unit and the reel transfer unit so as to detach the reel from the feeder in a state where the feeder to which the reel is attached is set in the feeder set unit.

7 Claims, 13 Drawing Sheets

(51) Int. Cl.
*B29C 65/74* (2006.01)
*B29C 65/78* (2006.01)

(56) References Cited

FOREIGN PATENT DOCUMENTS

| | | |
|---|---|---|
| JP | 9-309649 A | 12/1997 |
| JP | 2014-197594 A | 10/2014 |
| WO | WO 2019/142336 A1 | 7/2019 |

REEL INSTALLATION AND REMOVAL DEVICE AND FEEDER PREPARATION SYSTEM

TECHNICAL FIELD

The present specification discloses a reel installation and removal device and a feeder preparation system.

BACKGROUND ART

Conventionally, there has been proposed a method of automatically installing and removing a reel on which a tape accommodating components is wound from a feeder. For example, Patent Literature 1 discloses that a reel detached from a feeder is received in a reel storage, or a reel delivered from the reel storage is attached to the feeder. As a result, it is assumed that an exchange operation of the reel can be performed without bothering the operator.

PATENT LITERATURE

Patent Literature 1: JP-A-2014-197594

BRIEF SUMMARY

Technical Problem

It can be said that promoting the automation of the exchange operation of the reel as described above can be regarded as an important issue for improving production efficiency. Here, since the number of feeders to which the reels are attached is limited and the feeders are often reused, it is necessary to first detach the reels attached to the feeders when a new reel is attached. At this time, it is necessary to appropriately process and detach the tape so that the efficiency when automatically attaching the detached reel next time is not reduced.

The main object of the present disclosure is to more appropriately detach a reel in a case where the reel is automatically installed and removed.

Solution to Problem

The present disclosure adopts the following means in order to achieve the above-described main object.

It is a gist that a reel installation and removal device of the present disclosure is a reel installation and removal device that installs and removes a reel on which a tape accommodating a component is wound to and from a feeder which feeds the tape by driving of a feeding section and supplies the component, the device including a feeder set unit on which the feeder is set so that the feeding section is driven, a reel transfer unit including a rotation section rotating the reel around a shaft, and configured to move relative to the feeder set unit to transfer the reel, a holding section configured to hold the tape of the reel mounted on the feeder, a cutting section configured to cut the tape, and a control device configured to execute a detachment control of driving the holding section and the cutting section so that the tape is held and cut in a portion to which the component has been supplied after driving the feeding section and the rotation section so that the tape is rewound and wound around the reel, and controlling the feeder set unit and the reel transfer unit so as to detach the reel from the feeder, in a state where the feeder to which the reel is attached is set in the feeder set unit.

In the reel installation and removal device of the present disclosure, since the feeder is set on the feeder set unit so as to be able to drive the feeding section of the tape, the tape can be rewound quickly when the reel is detached. In addition, the tape can be appropriately rewound on the reel by the rotation section of the reel transfer unit. In addition, by rewinding and cutting the tape to a portion to which the component has been supplied, it is possible to prevent the component from being affected by a distal end process of the tape when attaching the reel next time. As a result, the reel can be more appropriately detached.

DESCRIPTION OF EMBODIMENTS

Figure 1:
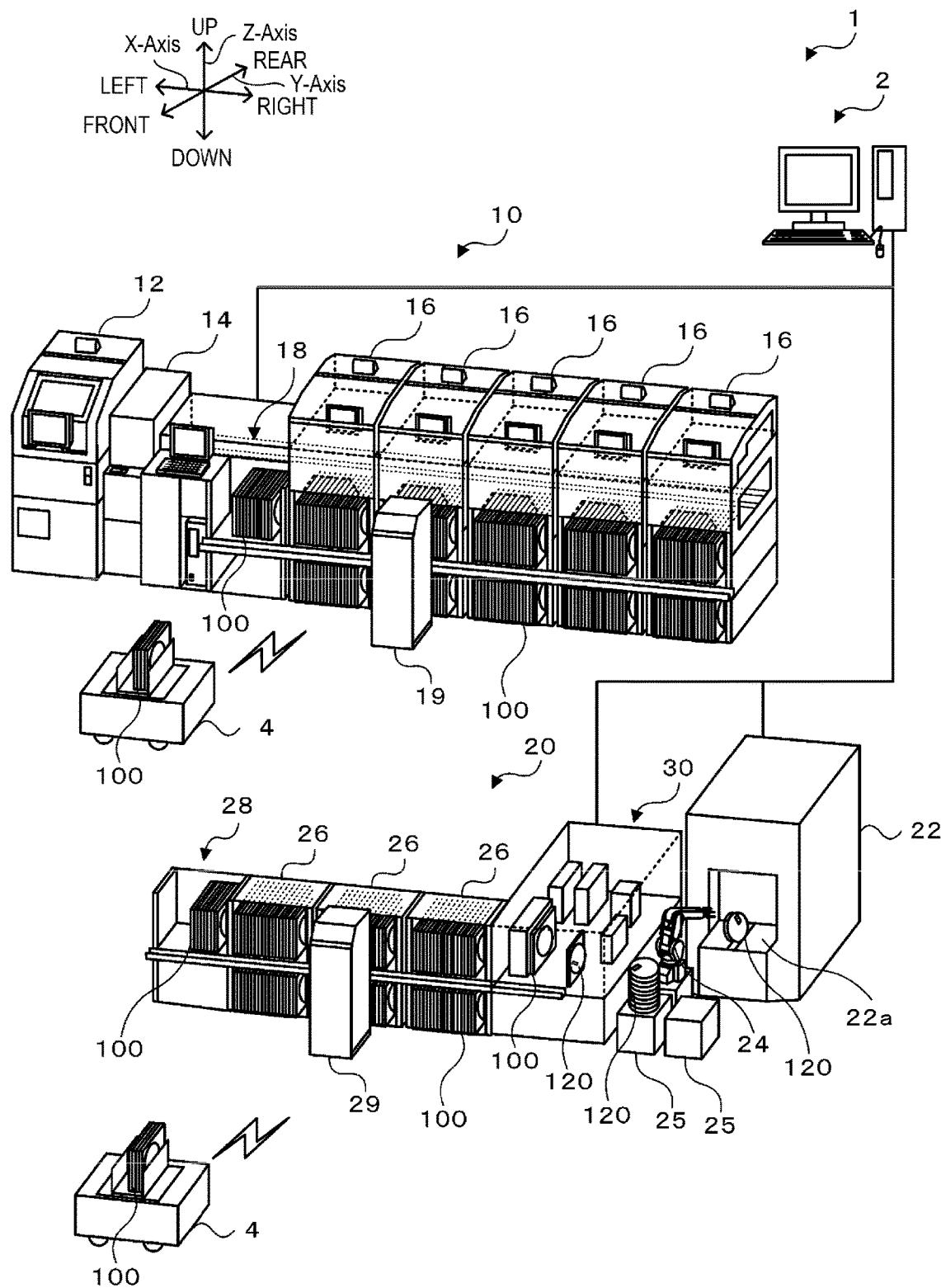
FIG. 1 is a schematic configuration diagram of component mounting system 1.

Next, embodiments of the present disclosure will be described with reference to the drawings. FIG. 1 is a schematic configuration diagram of component mounting system 1 of the present embodiment. Component mounting system 1 is provided with mounting line 10 for mounting a component on a board, preparation line 20 for preparing the supply of the component, and management device 2 for managing the entire system, and these lines and device are installed in a factory or the like. Management device 2 is configured as a computer including CPU, ROM, RAM, and HDD (not illustrated), outputs information and instructions related to mounting to each device of mounting line 10, and outputs information and instructions related to preparation to each device of preparation line 20. In the present embodiment, a left-right direction (X-axis), a front-rear direction (Y-axis), and an up-down direction (Z-axis) are as illustrated in FIG. 1.

As illustrated in FIG. 1, mounting line 10 is provided with printing device 12 for printing solder on the board, printing inspection device 14 for inspecting the state of the printed solder, and mounting device 16 for mounting the component on the board. Multiple mounting devices 16 are installed side by side along the conveyance direction of the board (X-axis direction), and multiple feeders 100 for supplying components can be mounted on a front surface. Each mounting device 16 is configured to pick up the component supplied from mounted feeder 100 and mount the component on the board. In addition, mounting line 10 is provided with feeder storage location 18 installed between mounting device 16 and printing inspection device 14 on the most upstream side in the conveyance direction of the board among multiple mounting devices 16, and loader 19 that moves front of multiple mounting devices 16 and front of feeder storage location 18 along the conveyance direction of the board. Automated guided vehicle (AGV) 4 or the operator accommodates feeder 100 necessary for feeder storage location 18, and collects unnecessary feeder 100 from feeder storage location 18. In addition, loader 19 is configured to take out necessary feeder 100 from feeder storage location 18 and provide feeder 100 to mounting device 16, or to collect unnecessary feeder 100 from each mounting device 16 and return feeder 100 to feeder storage location 18. Mounting line 10 may be provided with a reflow device or the like that performs a reflow process of the board on which the component is mounted.

Figure 2:
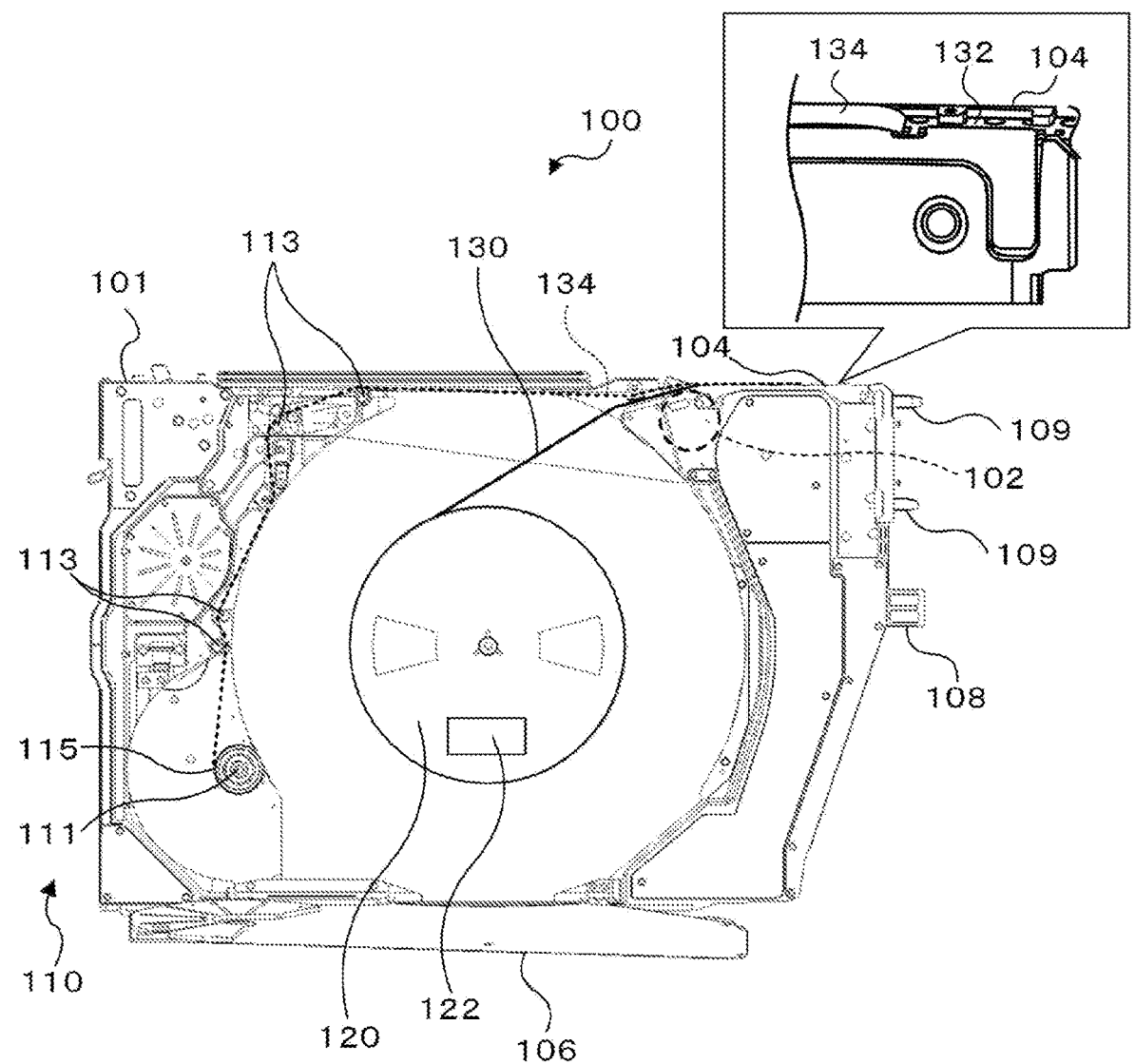
FIG. 2 is a schematic configuration diagram of feeder 100.

Here, FIG. 2 is a schematic configuration diagram of feeder 100. In feeder 100, reel 120 on which tape 130 accommodating the component is wound is attached to be installed and removed to main body 101, and the component is supplied by feeding tape 130. Label 122 that indicates the ID of reel 120, information on the component type accommodated by tape 130, and the like is attached to reel 120. Tape 130 is configured to include bottom tape 132 in which multiple cavities (recessed portions) are formed at predetermined intervals in the longitudinal direction and components are accommodated in each cavity, and cover tape 134 that is adhered so as to cover the surface of bottom tape 132. Engagement holes are formed in tape 130 at equal intervals in the longitudinal direction.

Feeder 100 is provided with main body 101, tape feeding section 102, tape guide 104, reel cover 106, connector 108, positioning pin 109, tape collecting section 110, and control section (not illustrated).

Tape feeding section 102 is provided with a sprocket in which a protrusion is provided on an outer periphery for engaging with an engagement hole of tape 130, and motor 103 (refer to FIG. 6) for driving the sprocket. In a state where tape 130 is engaged with the sprocket, tape feeding section 102 intermittently rotates the sprocket by the forward rotation of the motor to pitch-feed tape 130 to the supply position of the component. In addition, tape feeding section 102 can rewind tape 130 toward reel 120 side by the reverse rotation of the motor. Tape guide 104 is provided on the upper portion of main body 101 to guide cover tape 134 peeled from tape 130 so as to be folded back toward tape collecting section 110, and to guide the bottom tape from which cover tape 134 is peeled to the supply position of the component. Tape guide 104 is configured to be able to slightly move up and down (open and close) with respect to main body 101. Reel cover 106 is provided at a lower edge portion of main body 101 in an openable and closable manner, covers reel 120 in a closed state so as not to fall off, and exposes reel 120 in an opened state (state in FIG. 2) to be installed and removed. Connector 108 and positioning pin 109 are provided so as to protrude from an end surface of main body 101. Although not illustrated, a connector to which connector 108 can be connected and a pin hole into which positioning pin 109 can be engaged are provided on a feeder base such as mounting device 16 and feeder storage location 18. Therefore, when feeder 100 is mounted on the feeder base, connector 108 is connected to the connector of the feeder base and positioning pin 109 engages with the pin hole. The control section (not illustrated) of feeder 100 can communicate with a control section or the like of mounting device 16 via the connector, and controls tape feeding section 102 so as to pitch-feed tape 130 in response to a component supply instruction.

Figure 3:
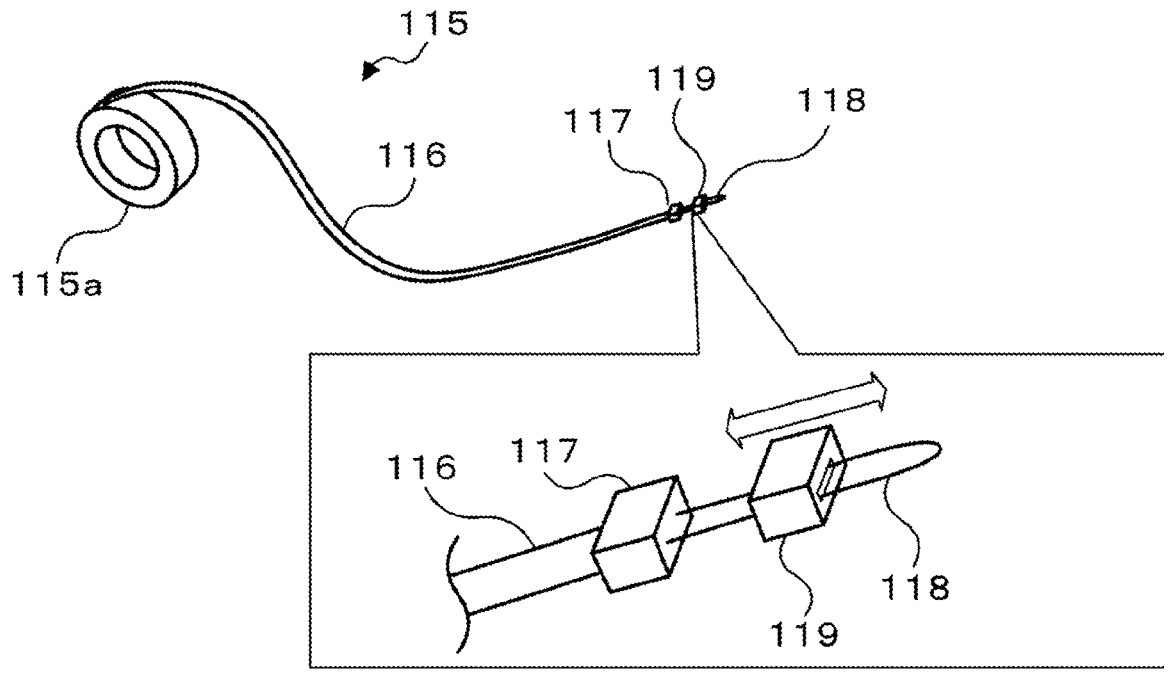
FIG. 3 is a schematic configuration diagram of collecting drum 115.

Tape collecting section 110 collects cover tape 134 peeled from tape 130, and as an example, a type (first type) in which cover tape 134 is collected while being wound using collecting drum 115 is illustrated. Tape collecting section 110 is provided with drum shaft 111 to which annular collecting drum 115 is attached to be installed and removed and rotated by a motor (not illustrated), and multiple guide pins 113 forming a guide path for guiding cover tape 134 folded back by tape guide 104 to collecting drum 115. FIG. 3 is a schematic configuration diagram of collecting drum 115, and collecting drum 115 is provided with splicing tape 116 extending from annular drum main body 115a. Splicing tape 116 is provided with fixing piece 117 fixed to a distal end, U-shaped loop 118 having both proximal end portions attached to an end surface of fixing piece 117, and slide piece 119 slidably attached along an extending direction of loop 118 (arrow direction in FIG. 3). As will be described later, loop 118 of splicing tape 116 is spliced to cover tape 134 by the sliding of slide piece 119. Tape collecting section 110 winds up and collects cover tape 134 together with splicing tape 116 by rotating drum shaft 111 to which collecting drum 115 is attached by the driving of the motor. In addition, for example, there is a type (second type) in which cover tape 134 is pulled in and collected by rotating a pair of gears while griping cover tape 134, but since the configuration is well known, a description thereof will be omitted.

Figure 4:
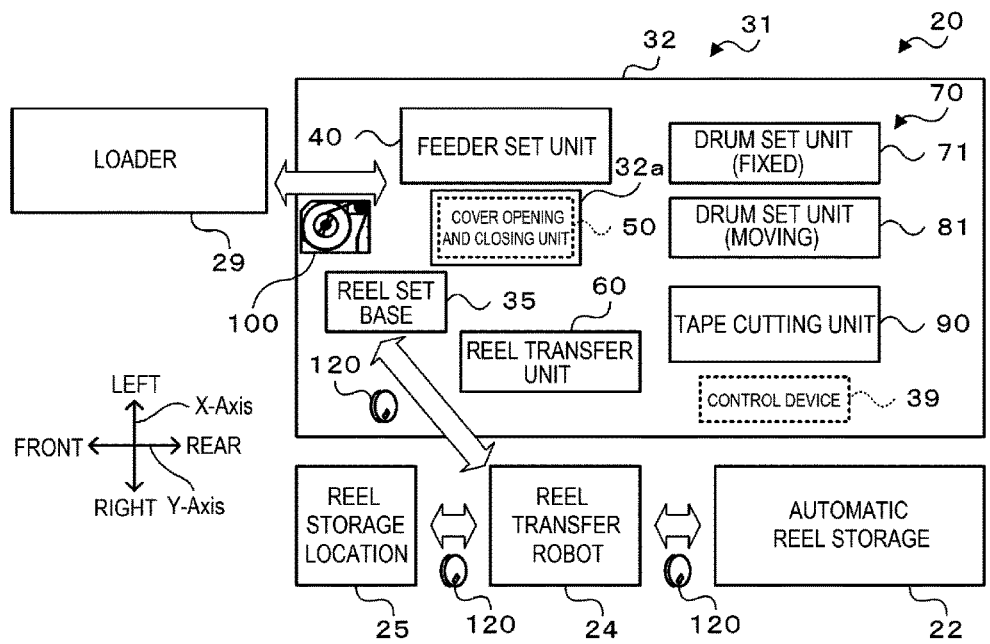
FIG. 4 is a layout diagram illustrating a layout of a part of a configuration of preparation line 20.

As illustrated in FIGS. 1 and 4, preparation line 20 is provided with automatic reel storage 22, reel transfer robot 24, reel storage location 25, feeder storage 26, feeder storage location 28, loader 29, and reel installation and removal device 30. Automatic reel storage 22 is configured to automatically store reel 120 placed on cradle 22a provided in front and store reel 120 in the storage, or to automatically take out necessary reel 120 from the storage and place reel 120 on cradle 22a. Reel transfer robot 24 is provided with a vertical articulated robot arm. Reel transfer robot 24 transfers reel 120 placed in reel storage location 25 by the operator to cradle 22a of automatic reel storage 22, or transfers reel 120 discharged to cradle 22a into reel installation and removal device 30. AGV 4 or the operator returns feeder 100 collected from mounting line 10 to feeder storage location 28, or takes out necessary feeder 100 from feeder storage location 28 to accommodate feeder 100 in feeder storage location 18 of mounting line 10. Loader 29 moves front of multiple feeder storages 26 and front of feeder storage location 28, takes out feeder 100 from feeder storage location 28 to be accommodated in feeder storage 26, or takes out feeder 100 from feeder storage 26 to be accommodated in feeder storage location 28. In addition, loader 29 transfers feeder 100 as an installation and removal target of reel 120 into reel installation and removal device 30. In FIG.

1, as reel storage location 25, two storage locations of a storage location for used (component shortage) reel 120 and a storage location for new reel 120 are exemplified.

Reel installation and removal device 30 is provided with reel set base 35, control device 39, feeder set unit 40, cover opening and closing unit 50, reel transfer unit 60, drum set unit 70, and tape cutting unit 90, which are provided on base plate 31.

Figure 5:
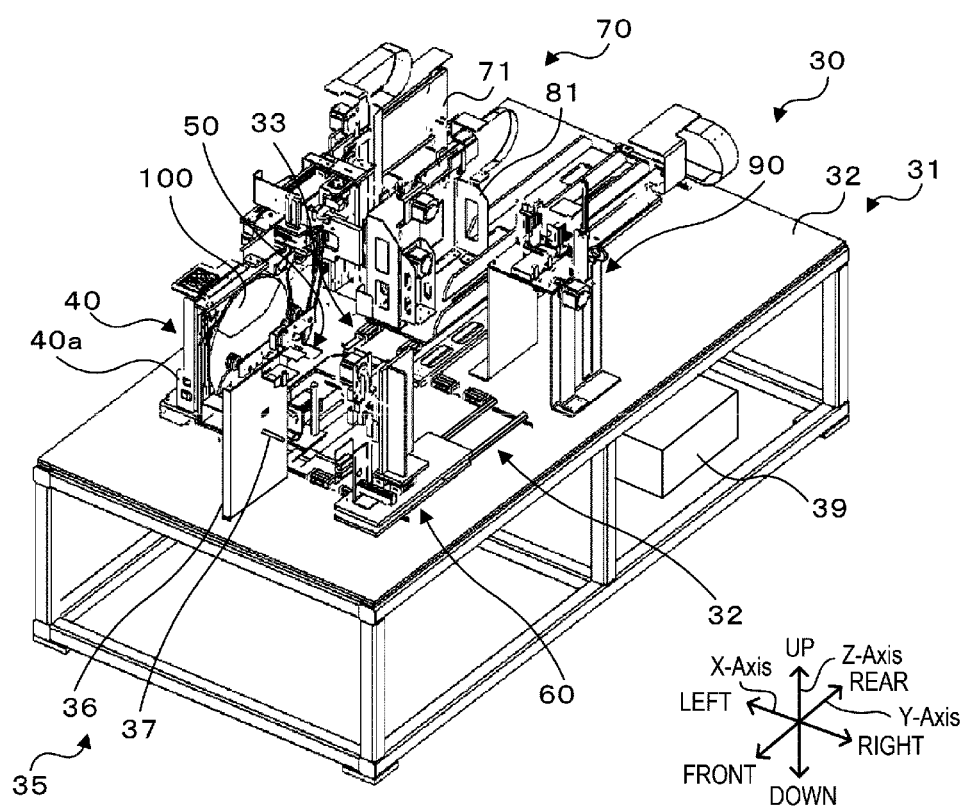
FIG. 5 is a schematic configuration diagram of reel installation and removal device 30.

As illustrated in FIG. 5, reel set base 35 is provided with base 36 and support pin 37. Base 36 is a plate-like member fixed so as to be erected vertically on upper plate 32 of base plate 31. Support pin 37 is a shaft-shaped member that is vertically erected from a plate surface on the right side in the drawing of base 36 and can be inserted into a center hole of reel 120. On reel set base 35, reel 120 is set to be installed and removed by reel transfer robot 24 or reel transfer unit 60 so that the center hole of reel 120 is inserted into support pin 37.

In feeder set unit 40, feeder 100 as the installation and removal target of reel 120 is transferred by loader 29 to base 40a fixed to upper plate 32 of base plate 31. Similar to the feeder base such as mounting device 16, base 40a is provided with a connector to which connector 108 of feeder 100 can be connected and a pin hole into which positioning pin 109 can be engaged. Therefore, control device 39 can communicate with the control section of feeder 100 attached to feeder set unit 40 via the connection of the connector to control tape feeding section 102.

Figure 6:
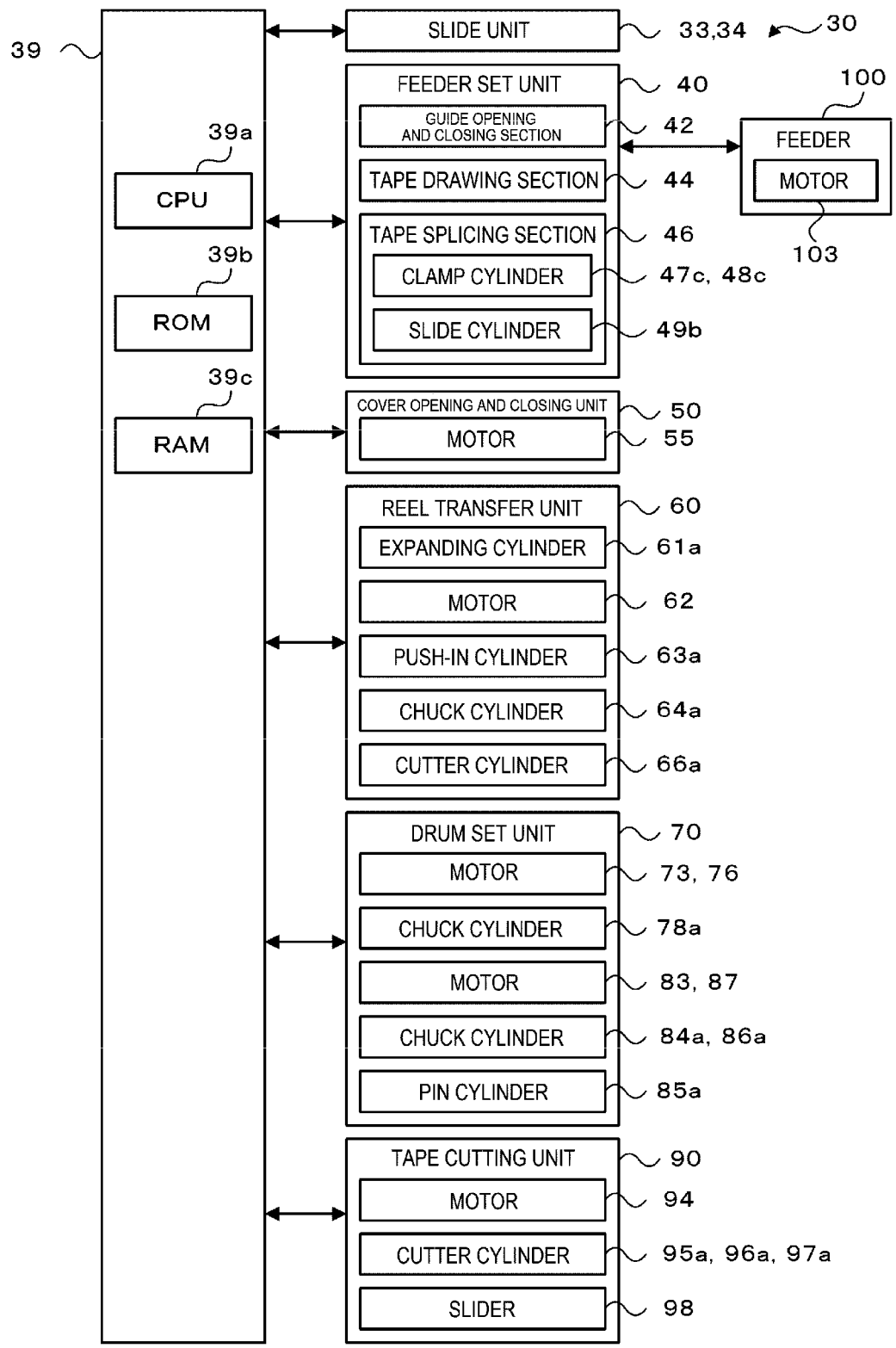
FIG. 6 is a block diagram illustrating an electrical connection relationship of reel installation and removal device 30.

In addition, as illustrated in FIG. 6, feeder set unit 40 is provided with guide opening and closing section 42, tape drawing section 44, and tape splicing section 46. Although not illustrated, guide opening and closing section 42 is provided with a clamp that grips tape guide 104 from the left-right direction, an opening and closing cylinder that opens and closes the clamp, and a lifting and lowering cylinder that lifts and lowers the clamp, and lifts and lowers tape guide 104 by the clamp while gripping tape guide 104 from the left-right direction. Tape drawing section 44 is provided with a clip for grasping a distal end of cover tape 134 of reel 120 attached to feeder 100, a moving section for moving the clip, and an actuator for opening and closing the clip via a wire connected to the clip. Tape drawing section 44 causes the clip to enter tape guide 104 in a state where tape guide 104 is positioned upward by guide opening and closing section 42, and draws out cover tape 134 by grasping the distal end of cover tape 134 and retracting the clip.

Figure 7A:
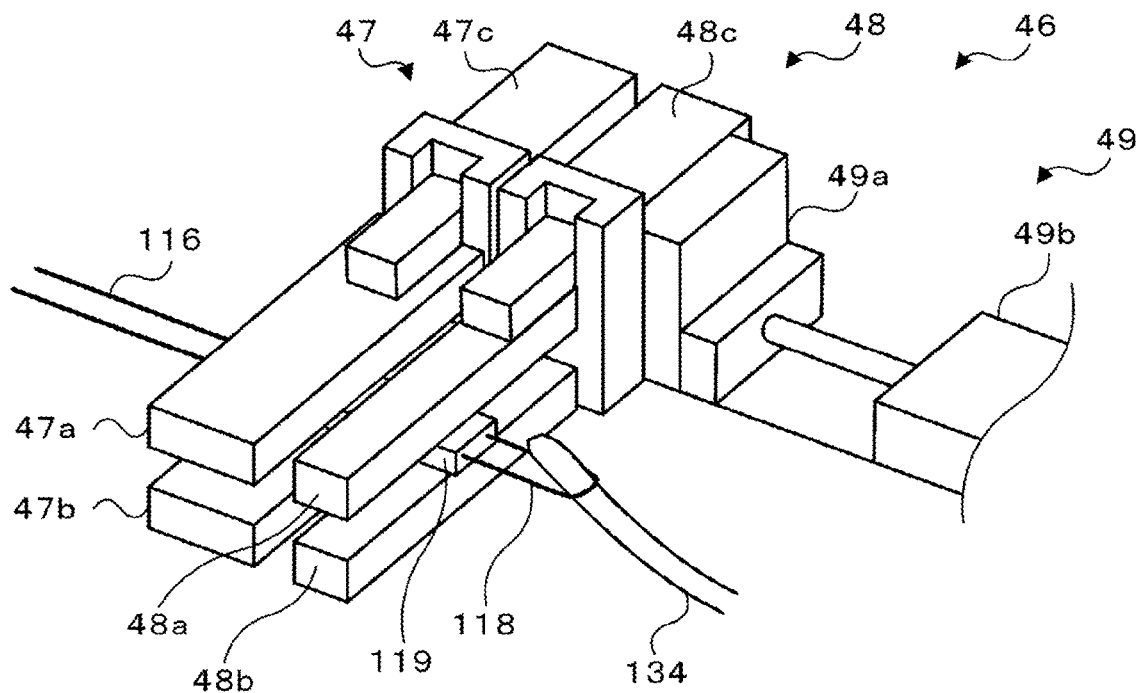
FIG. 7 is a schematic configuration diagram of tape splicing section 46.
Figure 7B:
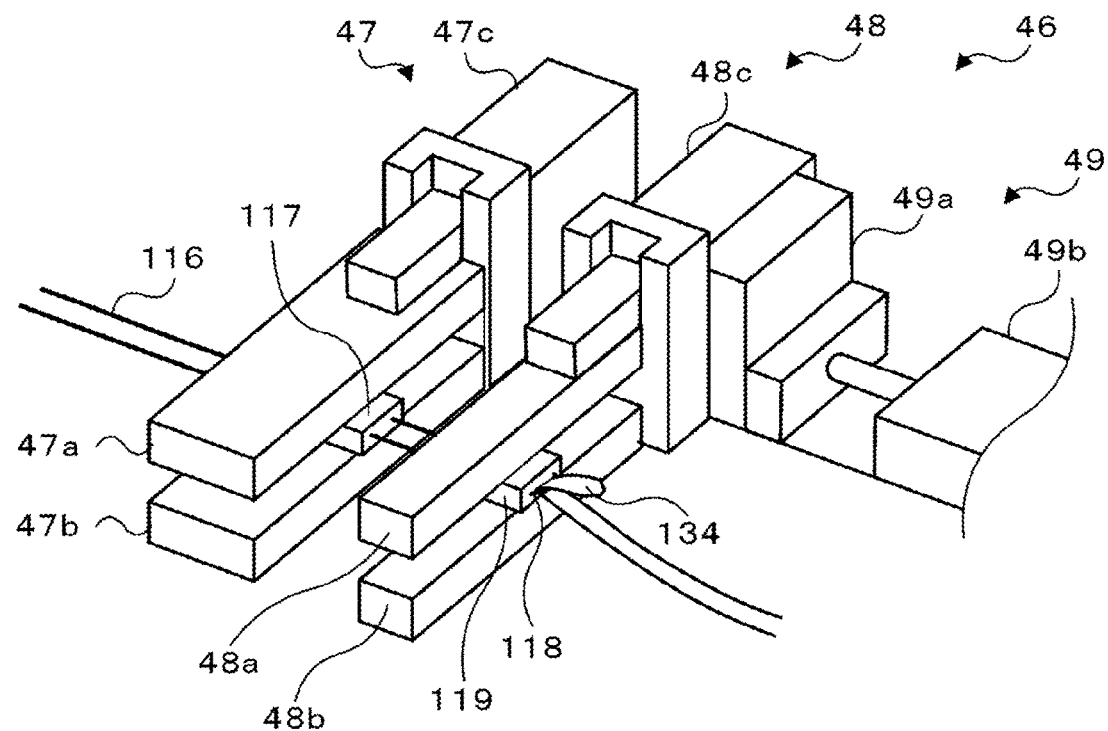
Figure 8:
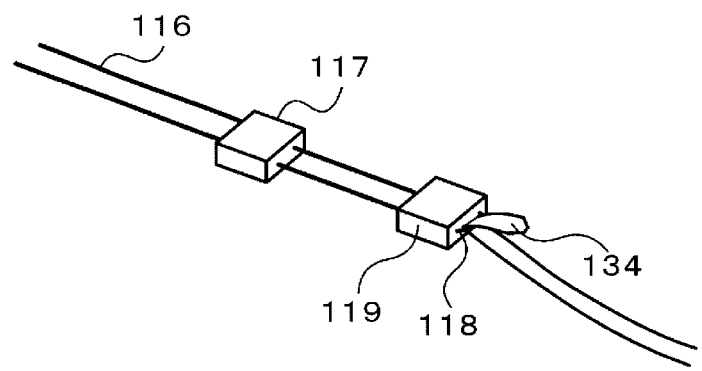
FIG. 8 is an explanatory diagram of a state where splicing tape 116 and cover tape 134 are spliced.

FIG. 7 is a schematic configuration diagram of tape splicing section 46. Tape splicing section 46 is provided with fixed clamp section 47, moving clamp section 48, and slide section 49. Fixed clamp section 47 is provided with a pair of clamp members 47a and 47b for clamping fixing piece 117 of splicing tape 116, and clamp cylinder 47c for performing clamping and releasing of the clamp by lifting and lowering clamp member 47a. Moving clamp section 48 is provided with a pair of clamp members 48a and 48b for clamping slide piece 119 of splicing tape 116, and clamp cylinder 48c for performing clamping and releasing of the clamp by lifting and lowering clamp member 48a. Slide section 49 is provided with slide block 49a coupled to clamp cylinder 48c of moving clamp section 48, and slide cylinder 49b that slides moving clamp section 48 together with slide block 49a. As illustrated in FIG. 7A, tape splicing section 46 is in a state where fixed clamp section 47 clamps fixed piece 117 and moving clamp section 48 clamps slide piece 119. In this state, feeder set unit 40 causes the distal end of cover tape 134 drawn out by tape drawing section 44 to be inserted into loop 118. As illustrated in FIG. 7B, moving clamp section 48 is moved to a distal end portion side of loop 118 by the operation of slide cylinder 49b to contract loop 118, so that tape splicing section 46 is coupled to loop 118 so that cover tape 134 does not come off. In this manner, splicing tape 116 and cover tape 134 are spliced to each other (refer to FIG. 8).

Figure 9:
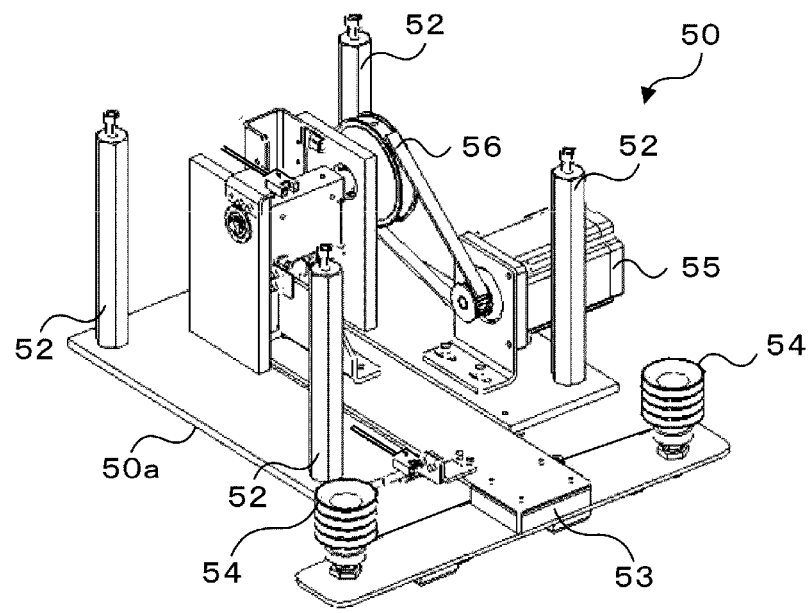
FIG. 9 is a schematic configuration diagram of cover opening and closing unit 50.
Figure 9:
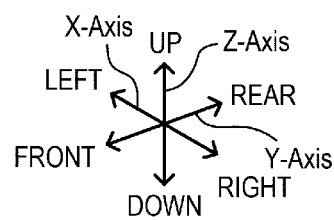

As illustrated in FIG. 9, cover opening and closing unit 50 is provided with base 50a, support column 52, pivot plate 53, pickup platen 54, motor 55, and pulley 56. Here, opening 32a (refer to FIG. 4) is formed in upper plate 32 of base plate 31 on the front surface side (on the right side) of feeder set unit 40. Cover opening and closing unit 50 is disposed below upper plate 32 by fixing four support columns 52 erected at four corners of rectangular flat base 50a to edges of opening 32a. Pivot plate 53 is formed in a substantially T-shape, a proximal end portion is supported by base 50a so as to be pivoted, and pickup platens 54 are attached to both ends of a distal end portion. Motor 55 is attached to base 50a, transmits a driving force via pulley 56, and pivots pivot plate 53. Pickup platen 54 is connected to a negative pressure source such as a vacuum pump via a tube, for example, and switches the presence or absence of pickup according to the presence or absence of operation of the vacuum pump. In cover opening and closing unit 50, when pivot plate 53 is pivoted by the forward rotation of motor 55 until pivot plate 53 is substantially orthogonal to base 50a, pickup platen 54 abuts on reel cover 106 of feeder 100. In this state, cover opening and closing unit 50 can open reel cover 106 so as to be accommodated in opening 32a by picking up reel cover 106 on pickup platen 54 by the operation of the vacuum pump, and then pivoting pivot plate 53 by rotating motor 55 in the reverse direction.

Figure 10:
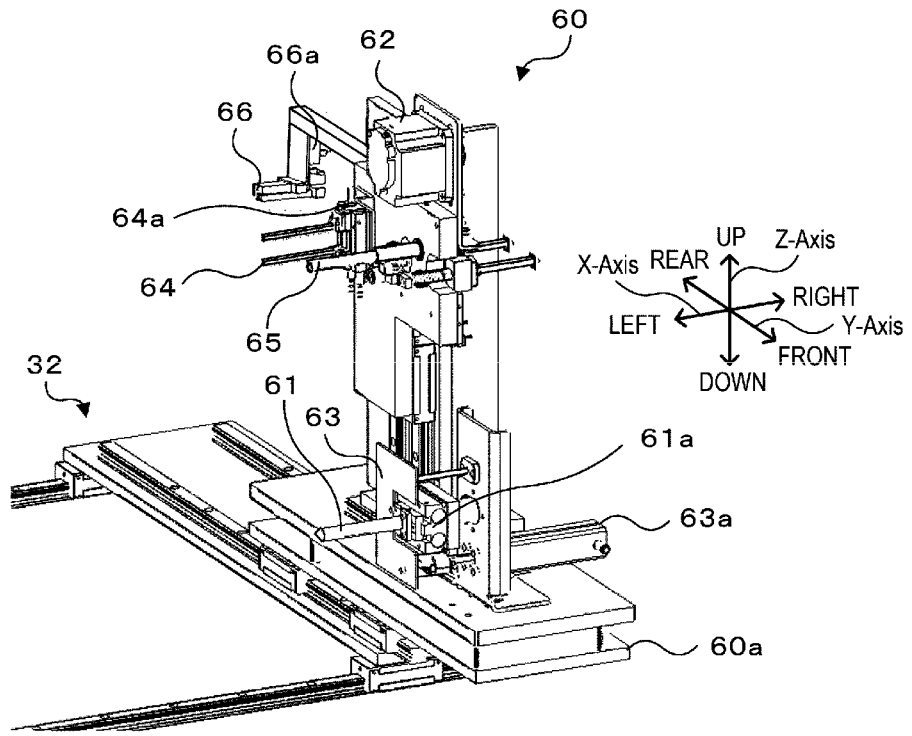
FIG. 10 is a schematic configuration diagram of reel transfer unit 60.

As illustrated in FIG. 10, reel transfer unit 60 is provided with slide base 60a, support pin 61, expanding cylinder 61a, motor 62, push-in plate 63, push-in cylinder 63a, chuck 64, chuck cylinder 64a, guide pin 65, cutter 66, and cutter cylinder 66a. Slide base 60a is slidable in the X-axis direction and the Y-axis direction by slide unit 33 disposed on upper plate 32. Slide unit 33 includes a well-known configuration including a slide rail laid in the sliding direction, a slider or the like that slides along the slide rail by the driving of an actuator such as a motor. Support pin 61 is, for example, a pin configured in a cylindrical shape by combining two semi-cylindrical members having a semicircular cross-section, and can be inserted into the center hole of reel 120 in a cylindrical state. In addition, when the two semi-cylindrical members move in a direction away from each other due to the operation of expanding cylinder 61a and the outer diameter is expanded, support pin 61 fits into the center hole of reel 120 and holds reel 120 so as not to fall off. Support pin 61 rotates around the shaft by transmitting the driving force of motor 62 via a pulley (not illustrated). Push-in plate 63 is a plate-like member formed so as to notch a location where support pin 61 is disposed, and moves along the extending direction of support pin 61 by the operation of push-in cylinder 63a to push and attach reel 120 to feeder 100 or the like. Chuck 64 holds a distal end of tape 130 of reel 120 by the operation of chuck cylinder 64a. Guide pin 65 guides the distal end of tape 130 of reel 120 toward chuck 64 side. Cutter 66 cuts the distal end of tape 130 by the operation of cutter cylinder 66a.

Figure 11:
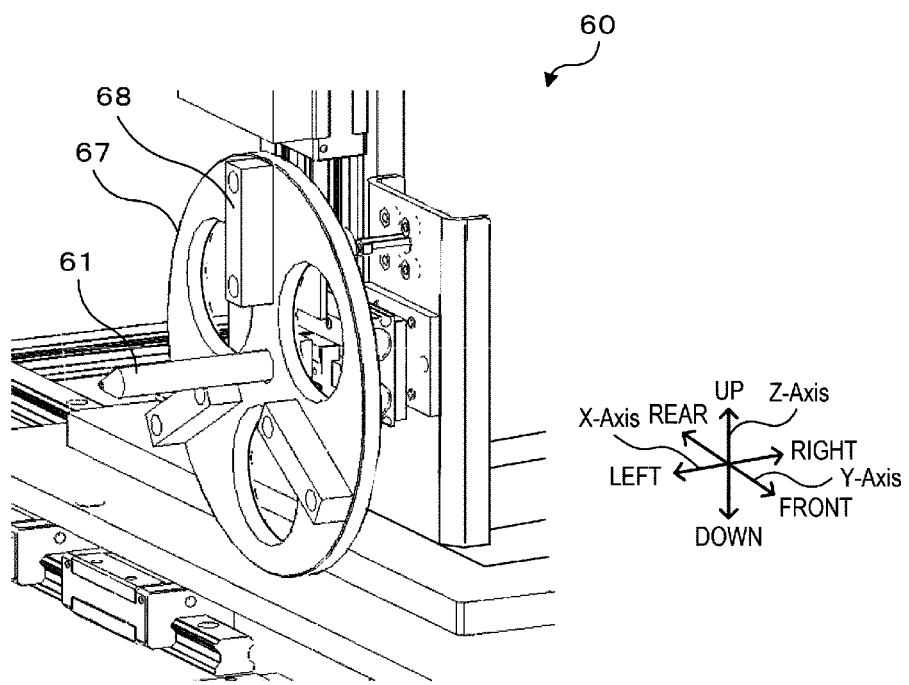
FIG. 11 is a schematic configuration diagram of push-turning disc 67 attached to reel transfer unit 60.

In addition, in reel transfer unit 60, push-turning disc 67 illustrated in FIG. 11 is configured to be installed and removed from support pin 61. Push-turning disc 67 is a disc-shaped member used when pushing and turning reel 120 so that support pin 61 in the cylindrical state can be inserted into the center hole, and multiple buffer members 68 are provided on the disc surface. Buffer member 68 is a rectangular parallelepiped-shaped member formed of, for example, urethane rubber or sponge, and is provided so that a longitudinal direction extends in a radial direction. When the outer diameter of support pin 61 is expanded by the operation of expanding cylinder 61a, support pin 61 fits into the center hole of push-turning disc 67 and can rotate integrally with push-turning disc 67. Although not illustrated, a storage location of push-turning disc 67 is provided at a predetermined position of upper plate 32, and reel transfer unit 60 can move to the storage location to attach push-turning disc 67 to support pin 61 or detach push-turning disc 67 from support pin 61.

Figure 12:
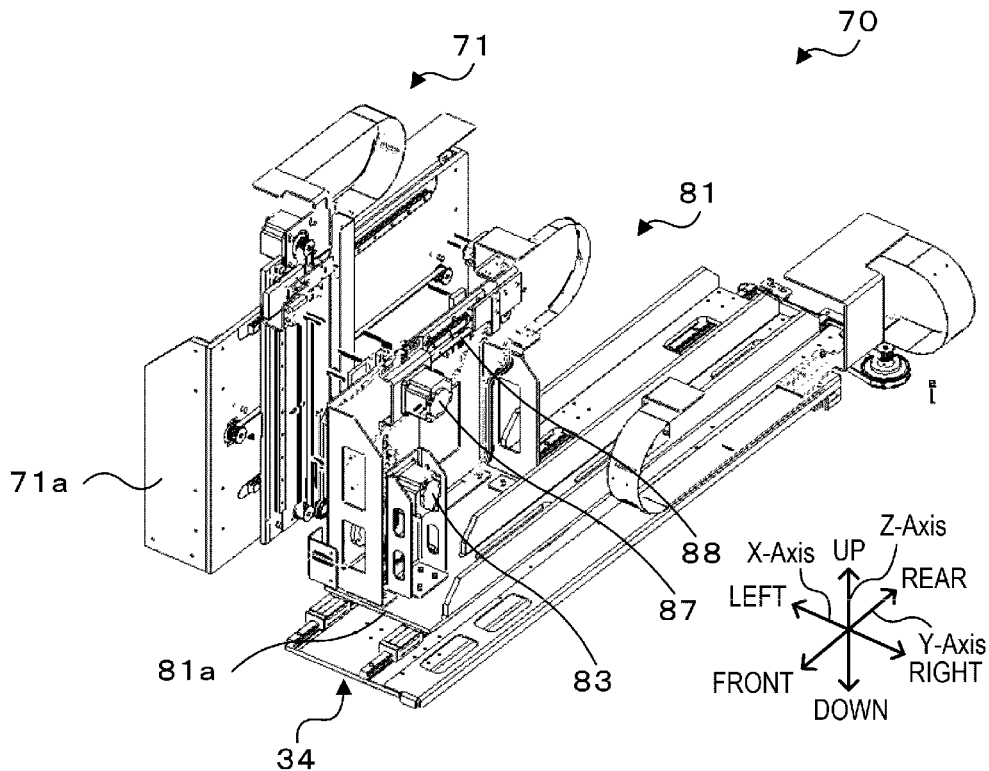
FIG. 12 is a schematic configuration diagram of drum set unit 70.
Figure 13:
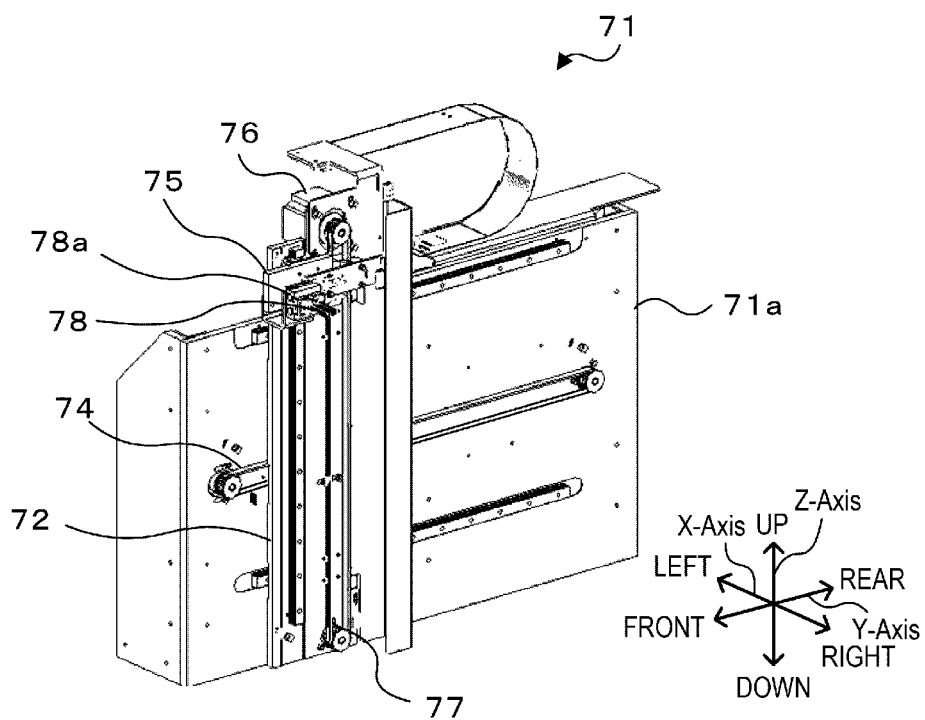
FIG. 13 is a schematic configuration diagram of fixed unit 71.

As illustrated in FIGS. 5 and 12, drum set unit 70 is provided with fixed unit 71 including fixed base 71a fixed so as to be erected on upper plate 32, and moving unit 81 including slide base 81a slidable in the X-axis direction and the Y-axis direction by slide unit 34 disposed on upper plate 32. As illustrated in FIG. 13, fixed unit 71 is provided with Y-axis slider 72, motor 73 (refer to FIG. 6), pulley 74, Z-axis slider 75, motor 76, pulley 77, chuck 78, and chuck cylinder 78a. Y-axis slider 72 moves a front surface (right surface in FIG. 13) of fixed base 71a along the Y-axis direction (front-rear direction) by transmitting the driving force of motor 73 disposed on a rear surface (left surface in FIG. 13) of fixed base 71a via pulley 74. Z-axis slider 75 is provided on Y-axis slider 72, and moves in the Z-axis direction (up-down direction) along the front surface of Y-axis slider 72 by transmitting the driving force of motor 76 via pulley 77. Chuck 78 is provided on Z-axis slider 75, and holds splicing tape 116 of collecting drum 115 by the operation of chuck cylinder 78a.

Figure 14:
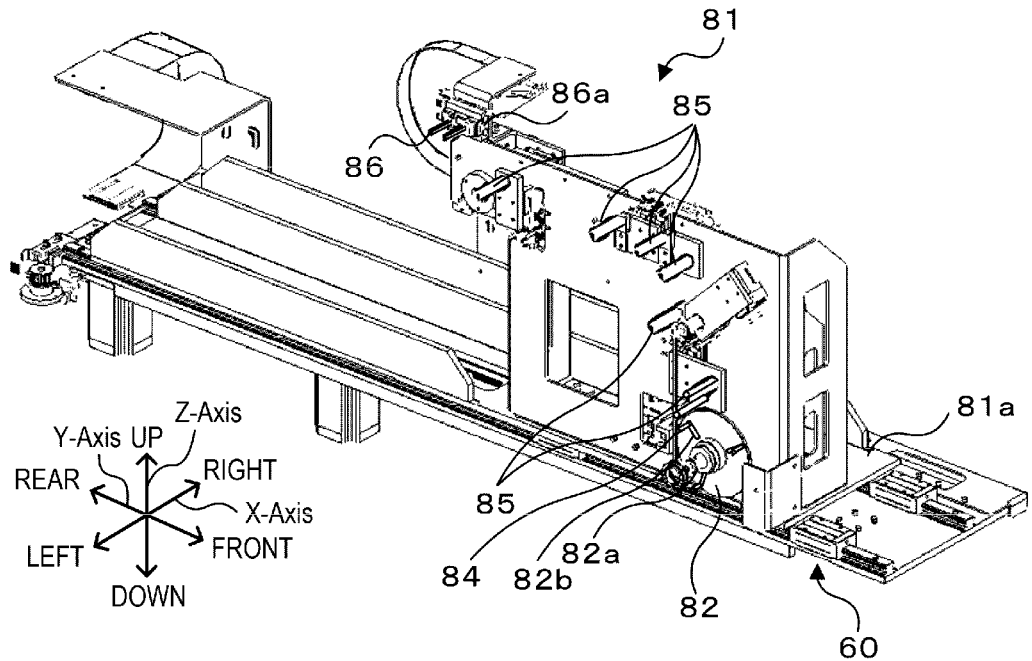
FIG. 14 is a schematic configuration diagram of moving unit 81.

As illustrated in FIGS. 12 and 14, moving unit 81 is provided with rotary transfer disc 82, motor 83, drum chuck 84, chuck cylinder 84a (refer to FIG. 6), guide pin 85, pin cylinder 85a (refer to FIG. 6), tape chuck 86, chuck cylinder 86a, motor 87, and pulley 88. Rotary transfer disc 82 is a disc-shaped member including support shaft 82a to which drum main body 115a of collecting drum 115 is attached to be installed and removed, and can rotate drum main body 115a by being rotated by the driving of motor 83. In addition, rotary transfer disc 82 is formed with multiple long holes 82b (for example, three) extending in the radial direction at equal intervals in the circumferential direction. Drum chuck 84 is provided with multiple (three) chuck claws that move in long hole 82b by the operation of chuck cylinder 84a, and each chuck claw is opened and closed by the operation of chuck cylinder 84a to grasp or release collecting drum 115. Multiple guide pins 85 are provided so as to be erected from the left surface of moving unit 81 to fixed unit 71 side. Multiple guide pins 85 are provided at least at positions corresponding to each of guide pins 113 so that a path similar to the guide path for guiding cover tape 134 to collecting drum 115 can be formed in feeder 100. Therefore, by moving chuck 78 holding a distal end of splicing tape 116 along the path formed by guide pin 85 by Y-axis slider 72 and Z-axis slider 75, drum set unit 70 can guide guide pin 85 so that splicing tape 116 crawls on guide pin 85 to form a path similar to the guide path in feeder 100. In addition, a part of guide pin 85 is moved by the driving of pin cylinder 85a, so that splicing tape 116 can be held by guide pins 85. Tape chuck 86 can hold the distal end of splicing tape 116 forming the guide path by the operation of chuck cylinder 86a, and the distal end position of held splicing tape 116 can be adjusted by transmitting the driving force of motor 87 via pulley 88 and moving in the Y-axis direction.

Figure 15:
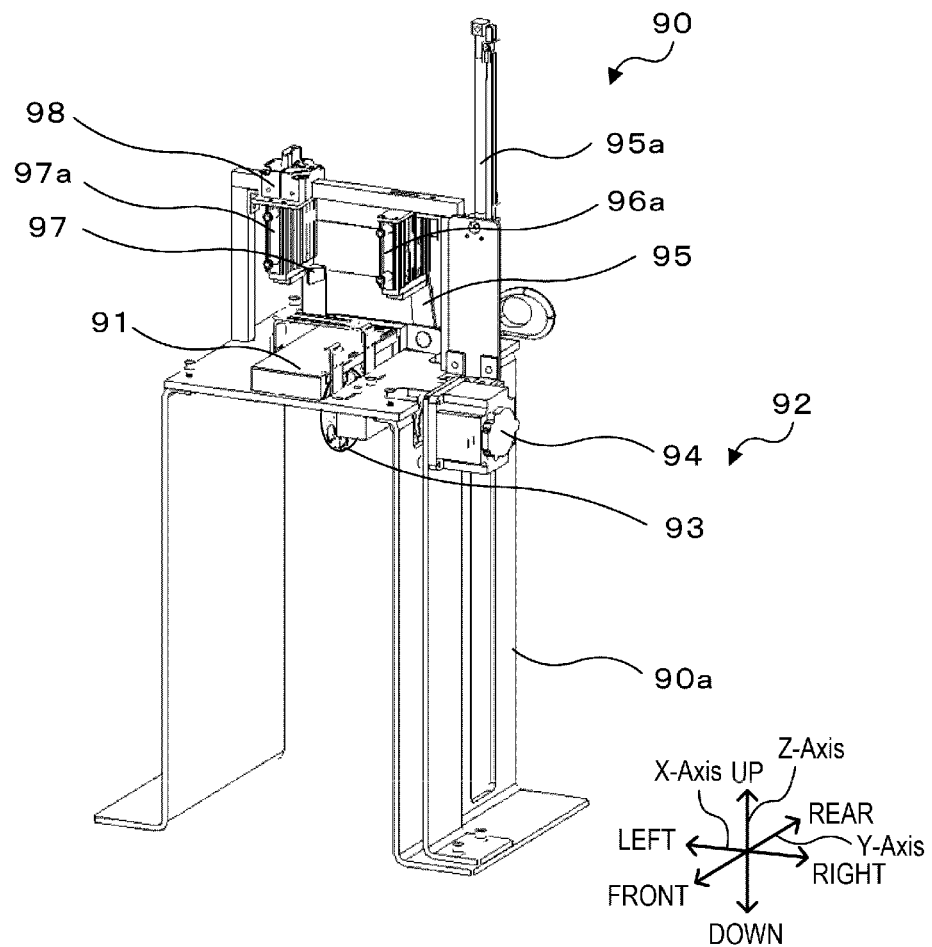
FIG. 15 is a schematic configuration diagram of tape cutting unit 90.
Figure 16:
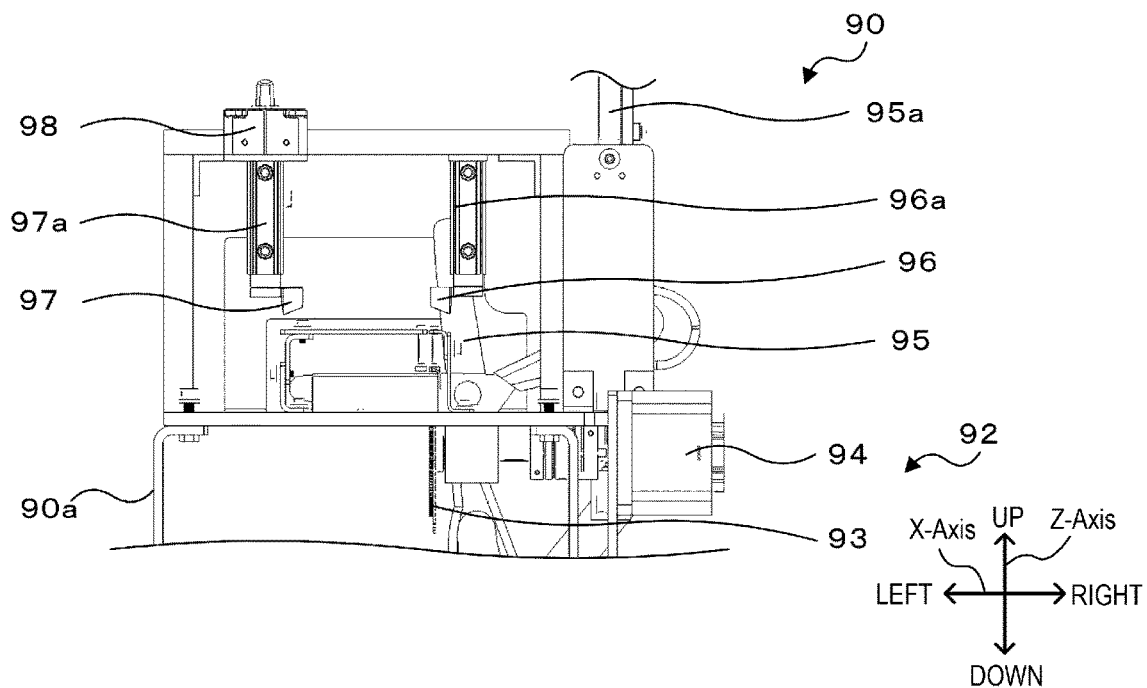
FIG. 16 is an enlarged configuration diagram of tape cutting unit 90.

As illustrated in FIGS. 15 and 16, tape cutting unit 90 is provided with base 90a, cutting base 91, tape feeding section 92, first tape cutter 95, second tape cutter 96, third tape cutter 97, and slider 98. Tape feeding section 92 is provided with sprocket 93 having a protrusion formed on an outer periphery for engaging with an engagement hole of tape 130, and motor 94 for driving sprocket 93. In a state where tape 130 fed from reel 120 of reel transfer unit 60 with respect to the right end of cutting base 91 is engaged with sprocket 93, tape feeding section 92 rotates sprocket 93 by the forward rotation of motor 94 to feed tape 130 toward the cutting position.

First tape cutter 95 has a scissor-shaped cutting blade disposed in a direction orthogonal to the feeding direction of tape 130, and is operated by the driving of cutter cylinder 95a to cut tape 130. In second tape cutter 96, a cutting blade is disposed obliquely with respect to the feeding direction of tape 130, and the right side of the distal end of tape 130 is cut in a tapered manner by the driving of cutter cylinder 96a. In third tape cutter 97, a cutting blade is disposed obliquely with respect to the feeding direction of tape 130, and the left side of the distal end of tape 130 is cut in a tapered manner by the driving of cutter cylinder 97a. Third tape cutter 97 is provided on slider 98 that slides in the X-axis direction (left-right direction) above cutting base 91, and is movable in the left-right direction. Therefore, by adjusting the position of third tape cutter 97 in accordance with the width of tape 130, tape cutting unit 90 can cut in a tapered manner the left side of the distal end of tape 130 fed out with reference to the right end of cutting base 91. By cutting the distal end of tape 130 (cover tape 134) in a tapered manner, it is possible to prevent the distal end from being caught when inserting tape 130 into loop 118, so that tape 130 can be smoothly inserted (refer to FIG. 7).

Control device 39 is provided with CPU 39a, ROM 39b, RAM 39c, and the like. Status information and the like are inputted from each unit of reel installation and removal device 30, and status information on reel transfer robot 24 and loader 29, instruction for installation and removal of reel 120, and the like are inputted from management device 2 to control device 39. Control device 39 outputs a control signal to each unit of reel installation and removal device 30 based on the information and the instruction for installation and removal to install and remove reel 120 to and from feeder 100 set in feeder set unit 40. In addition to these configurations, reel installation and removal device 30 may be provided with a camera capable of capturing an image of label 122 of reel 120 attached to feeder 100. In addition, when reel 120 is detached from feeder 100 set in feeder set unit 40, a temporary fastening portion for fastening tape 130 with a temporary fastening tape may be provided, or a peeling portion for peeling the temporary fastening tape when reel 120 is attached may be provided.

Figure 17:
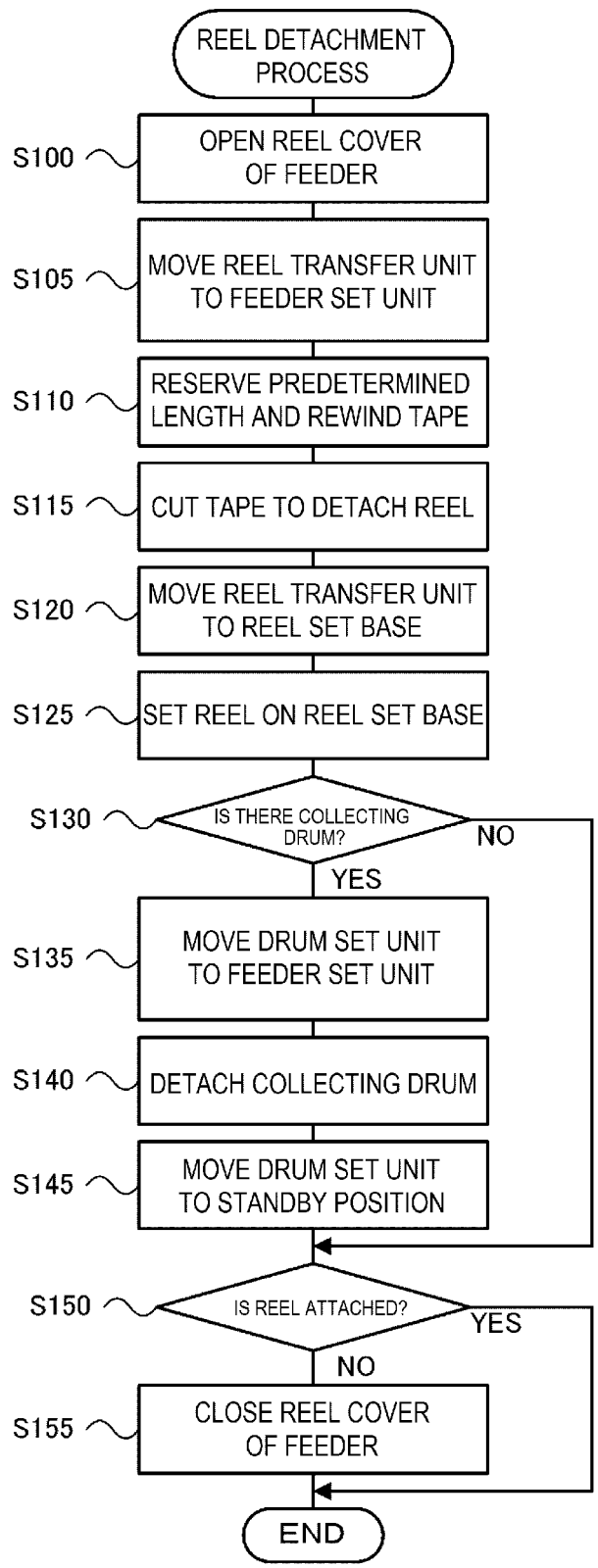
FIG. 17 is a flowchart illustrating an example of a reel detachment process.

The following is a description of the operation of reel installation and removal device 30 configured in this manner. FIG. 17 is a flowchart illustrating an example of a reel detachment process. The process is executed by control device 39 in a case where feeder 100 as a detachment target from reel 120 is set in feeder set unit 40. First, control device 39 causes cover opening and closing unit 50 so as to open reel cover 106 (S100). As described above, since cover opening and closing unit 50 holds reel cover 106 in opening 32a, reel cover 106 in the opened state can be prevented from interfering with the movement or operation of other units. Next, control device 39 controls slide unit 33 so that reel transfer unit 60 moves to feeder set unit 40 (S105). Reel transfer unit 60 is in a state where push-turning disc 67 is attached to support pin 61. Subsequently, control device 39 causes feeder 100 and reel transfer unit 60 set in feeder set unit 40 so as to reserve a predetermined length to rewind tape 130 (S110). In S110, control device 39 causes tape feeding section 102 of feeder 100 so as to rotate in the reverse direction, and controls reel transfer unit 60 so as to push and turn reel 120 in the reverse rotation direction by push-turning disc 67. When S110 is ended, control device 39 causes reel transfer unit 60 so as to detach push-turning disc 67 from support pin 61.

Here, in first type feeder 100 using collecting drum 115, since a distal end of cover tape 134 is spliced to splicing tape 116 when reel 120 is attached (refer to FIG. 8) next time, the length of tape 130 (cover tape 134) that needs to be reserved when reel 120 is detached may be shortened. On the other hand, in second type feeder 100 or the like using a take-up gear, it is necessary to reserve a length necessary for cover tape 134 to reach the take-up gear when reel 120 is attached next time. In the present embodiment, in S110, a predetermined length is reserved according to the type requiring the longest length (here, second type) so that reel 120 can handle any type of feeder 100 to be attached next time.

When tape 130 is rewound, control device 39 causes reel transfer unit 60 so as to cut tape 130 to detach reel 120 from feeder 100 (S115). Reel transfer unit 60 cuts tape 130 by causing cutter 66 to enter feeder 100. Next, control device 39 controls slide unit 33 so that reel transfer unit 60 moves to reel set base 35 (S120), and causes reel transfer unit 60 so as to set detached reel 120 on reel set base 35 (S125). When there are remaining components on tape 130, reel 120 set on reel set base 35 is transferred to cradle 22a of automatic reel storage 22 by reel transfer robot 24. In addition, reel 120 having no remaining components is transferred to used reel storage location 25 by reel transfer robot 24, or is discharged from a discharge port (not illustrated) formed in upper plate 32.

Subsequently, control device 39 determines whether feeder 100 is the first type using collecting drum 115 (S130). When it is determined that the type is the first type, control device 39 controls slide unit 34 so that moving unit 81 of drum set unit 70 moves to feeder set unit 40 (S135). Next, control device 39 causes drum chuck 84 of moving unit 81 so as to detach collecting drum 115 from feeder 100 (S140). Control device 39 controls slide unit 34 so that moving unit 81 moves to a standby position in front of fixed unit 71 or the like (S145). When it is determined in S130 that the type is not the first type, control device 39 skips S135 to S145. Collecting drum 115 detached in S140 is assumed to be collected in a dust box or the like from a discharge port (not illustrated) formed in upper plate 32 until moving unit 81 moves to the standby position. The operator may detach cover tape 134 from collecting drum 115 collected in the dust box, discard cover tape 134, and set collecting drum 115 at a predetermined location where moving unit 81 of drum set unit 70 can receive collecting drum 115.

Control device 39 determines whether reel 120 is attached to feeder 100 set in feeder set unit 40 (S150). When it is determined that reel 120 is not to be attached, control device 39 causes cover opening and closing unit 50 so as to close reel cover 106 (S155), and ends the reel detachment process. On the other hand, when it is determined that reel 120 is attached, control device 39 skips S155, and ends the reel detachment process while maintaining reel cover 106 open.

Figure 18:
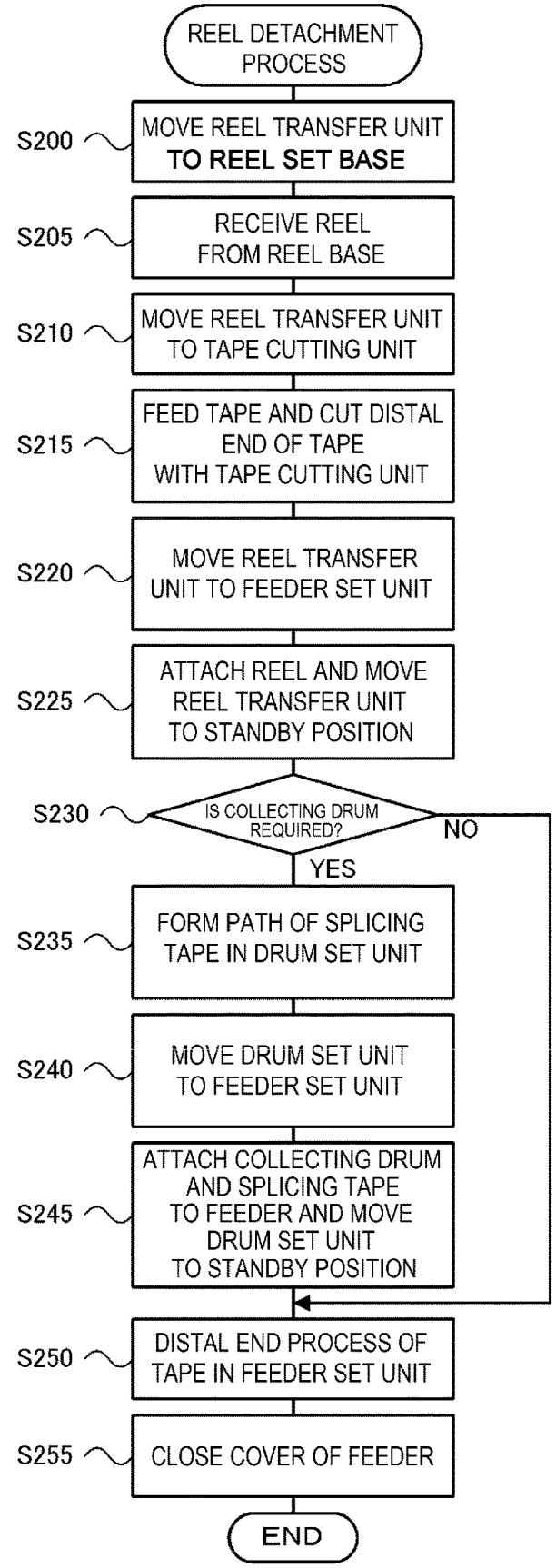
FIG. 18 is a flowchart illustrating an example of a reel attachment process.

Next, an attachment process of the reel will be described. FIG. 18 is a flowchart illustrating an example of the reel attachment process. The process is executed by control device 39 in a case where feeder 100 as an attachment target to reel 120 is set in feeder set unit 40, for example, in a case where the reel detachment process in FIG. 17 ends with reel cover 106 open, or the like. First, control device 39 controls slide unit 33 so that reel transfer unit 60 moves to reel set base 35 (S200). Reel transfer unit 60 is in a state where push-turning disc 67 is detached from support pin 61. Next, control device 39 causes reel transfer unit 60 to receive reel 120 set on reel set base 35 (S205). Subsequently, control device 39 controls slide unit 33 so that reel transfer unit 60 moves to tape cutting unit 90 (S210). Reel transfer unit 60 and tape cutting unit 90 are controlled so that a necessary amount of tape 130 is fed from reel 120 to cut the distal end of tape 130 into a necessary shape (S215). When feeder 100 as an attachment target is the first type using collecting drum 115, control device 39 causes tape cutting unit 90 so as to cut in a tapered manner the distal end of tape 130 in order to be easily inserted into loop 118 as described above. In addition, when such tapered cutting is not necessary, control device 39 causes tape cutting unit 90 so as to cut only in a direction orthogonal to the longitudinal direction of tape 130, for example. The distal ends of all tapes 130 may be cut in a tapered manner. When tape 130 is cut by tape cutting unit 90, control device 39 causes reel transfer unit 60 so as to rewind tape 130 and hold the distal end of tape 130 by chuck 64.

Subsequently, control device 39 controls slide unit 33 so that reel transfer unit 60 moves to feeder set unit 40 (S220). In a case where reel cover 106 of feeder 100 set in feeder set unit 40 is in the closed state, control device 39 causes cover opening and closing unit 50 so as to open reel cover 106 before S220. Next, control device 39 causes reel transfer unit 60 and slide unit 33 so as to attach reel 120 to feeder 100 set in feeder set unit 40, and move to a predetermined standby position (S225).

Control device 39 determines whether feeder 100 is the required first type of collecting drum 115 (S230). When it is determined that the tape is the first type, control device 39 causes drum set unit 70 so as to cause splicing tape 116 to crawl along the path formed by guide pins 85, to hold splicing tape 116 by guide pins 85, and to grasp and hold the distal end of splicing tape 116 by tape chuck 86 (S235). Next, control device 39 controls slide unit 34 so that moving unit 81 moves to feeder set unit 40 (S240). Subsequently, control device 39 causes drum set unit 70 so as to attach collecting drum 115 and splicing tape 116 to feeder 100 of feeder set unit 40 (S245). Control device 39 attaches splicing tape 116 crawled along the path formed by guide pin 85 so as to pass splicing tape 116 to each guide pin 113 of feeder 100 in that state, and then causes drum set unit 70 so as to release the holding of splicing tape 116 by guide pins 85. As a result, splicing tape 116 can be attached along the guide path of feeder 100. In addition, when it is determined in step S230 that collecting drum 115 is not a necessary type, control device 39 skips S235 to S245. Control device 39 may execute S235 to S245 before S200 to S215, or may execute S235 to S245 in parallel with S200 to S215.

Control device 39 causes feeder set unit 40 so as to perform a distal end process of tape 130 (S250). For example, when feeder 100 is the first type, control device 39 causes feeder set unit 40 so as to draw cover tape 134 and splice cover tape 134 to splicing tape 116. In addition, when feeder 100 is the second type, control device 39 causes feeder set unit 40 so as to draw cover tape 134 and feed to the guide path. When reel 120 is attached in this manner, control device 39 causes cover opening and closing unit 50 so as to close reel cover 106 (S255), and ends the reel attachment process. In a case where reel installation and removal device 30 is provided with a camera capable of capturing an image of label 122 of reel 120, control device 39 may cause the camera to capture an image of label 122 before closing reel cover 106, and may perform image processing on the captured image to recognize the information on label 122. Based on the recognized information, control device 39 may confirm whether correct reel 120 is attached, register the attachment in association with feeder 100, or transmit the recognized information to management device 2 together with the notification that the attachment of reel 120 is completed.

Here, correspondences between the constituent elements of the present embodiment and constituent elements of the present disclosure will be clarified. Reel installation and removal device 30 of the present embodiment corresponds to the reel installation and removal device of the present disclosure, feeder set unit 40 corresponds to a feeder set unit, reel transfer unit 60 corresponds to a reel transfer unit, chuck 64 corresponds to a holding section, cutter 66 corresponds to a cutting section, and control device 39 corresponds to a control device. Collecting drum 115 corresponds to a drum-shaped collecting section. Guide pin 85 corresponds to a path forming section, chuck 78, Y-axis slider 72, and Z-axis slider 75 correspond to a guide section, drum set unit 70 corresponds to a collecting section set unit, and tape splicing section 46 corresponds to a splicing section. Reel cover 106 corresponds to an opening and closing cover, and cover opening and closing unit 50 corresponds to a cover opening and closing unit. In addition, preparation line 20 corresponds to a feeder preparation system, feeder storage 26 corresponds to a feeder storage section, loader 29 corresponds to a feeder preparation device, reel set base 35 corresponds to a reel set base, and reel transfer robot 24 corresponds to a reel preparation device.

In reel installation and removal device 30 described above, since feeder 100 is set on feeder set unit 40 so that tape feeding section 102 (feeding section) can be driven, tape 130 can be quickly rewound when reel 120 is detached. In addition, reel transfer unit 60 rotates push-turning disc 67, so that tape 130 can be appropriately rewound on reel 120. In addition, tape 130 is rewound to a portion to which the component has been supplied and cut, so that it is possible to prevent the component from falling off by the distal end process of tape 130 when reel 120 is attached next time. As a result, reel 120 can be more appropriately detached.

In addition, since tape 130 (cover tape 134) is rewound so as to reserve a predetermined length, it is possible to suppress the time required for the process to collect cover tape 134 when reel 120 is attached next time. In addition, since splicing tape 116 is attached to feeder 100 after being along disposed the guide path of cover tape 134, drum set unit 70 can efficiently attach collecting drum 115. In addition, since the detachment and attachment of reel 120 are performed by a common device, reel installation and removal device 30 can be configured to be more compact than those performed by separate devices. In addition, since reel cover 106 in the opened state is held at a position that does not interfere with the movement of other units, cover opening and closing unit 50 can further efficiently detach and attach the reel.

It is needless to say that the present disclosure is not limited to the embodiments described above, and various forms can be implemented within the technical scope of the present disclosure.

For example, in the above embodiment, tape 130 is rewound by reserving a predetermined length when reel 120 is detached; however, the configuration is not limited to this, and, for example, an extension tape having a necessary length may be added to the distal end of tape 130 when reel 120 is attached next time.

In the above embodiment, both chuck 64 and cutter 66 are provided in reel transfer unit 60; however, the configuration is not limited to this, either or both may be provided in a place other than reel transfer unit 60, and, for example, may be provided in feeder set unit 40.

In the above embodiment, first type feeder 100 to be collected by collecting drum 115 is exemplified, and drum set unit 70 that installs and removes collecting drum 115 and forms the path of splicing tape 116 is provided; however, the configuration is not limited to this. For example, reel transfer unit 60 may detach collecting drum 115 together with reel 120 instead of drum set unit 70. In addition, the path formation of splicing tape 116 may be performed by feeder set unit 40 or reel transfer unit 60 after collecting drum 115 is attached to feeder 100. In such a case or in a case where first type feeder 100 is not handled, drum set unit 70 need not be provided.

In the above embodiment, an example in which reel cover 106 is attached to the lower edge of feeder 100 in an openable and closable manner is exemplified; however, the configuration is not limited to this, reel cover 106 may be attached to feeder 100 in an openable and closable manner, and the opening and closing direction may be the left-right direction.

In the above embodiment, feeder 100 is set such that feeder set unit 40 can drive tape feeding section 102; however, the configuration is not limited to this, and feeder 100 may be set such that tape feeding section 102 cannot be driven. In addition, although reel transfer unit 60 is configured to push and turn reel 120 by using push-turning disc 67, reel 120 may be rotated by a method other than push-turning. Alternatively, reel transfer unit 60 may not rotate reel 120 (may not include a rotation section). In addition, control device 39 may be driven at least chuck 64 (holding section) and cutter 66 (cutting section) so as to hold and cut tape 130 at the portion to which the component has been supplied, in a state where feeder 100 to which reel 120 is attached is set in feeder set unit 40.

In the above embodiment, in addition to reel installation and removal device 30, preparation line 20 (preparation system) including loader 29 for setting feeder 100 in feeder set unit 40, reel transfer robot 24 for setting reel 120 in reel set base 35, and the like is exemplified; however, the configuration is not limited to this. Reel installation and removal device 30 is individually disposed, and the set of feeder 100 and the set of reel 120 may be performed by another device such as AGV, or may be performed by an operator. In addition, the disposition of each unit of reel installation and removal device 30 and the function of each unit are examples, and reel installation and removal device 30 as a whole may be configured to automatically install and remove reel 120 with respect to feeder 100.

Here, the reel installation and removal device of the present disclosure may be configured as follows. In the reel installation and removal device of the present disclosure, the tape may include a bottom tape accommodating the component and a cover tape covering the component, and may be capable of supplying the component by peeling off the cover tape, as the feeder, multiple types of feeders including a type having a drum-shaped collecting section collecting the cover tape while winding the cover tape together with a splicing tape to which a distal end is spliced to the cover tape and a type in which the cover tape is pulled and collected to the collecting section different from the drum shape may be provided, and the control device may drive the feeding section and the rotation section to rewind the cover tape by reserving a length adaptable for any type when the reel is attached to the feeder next time in the detachment control. Accordingly, it is possible to appropriately detach the reel in consideration of the case where the reel is attached next time. Therefore, it is possible to efficiently perform the automatic attachment of the reel while suppressing the time required for the process to collect the cover tape when the reel is attached next time.

In the reel installation and removal device according to the present disclosure, the feeder may be provided with a guide path guiding the cover tape to the collecting section, the device further may include a collecting section set unit configured to be moved relative to the feeder set unit, having a path forming section forming a path along the guide path and a guide section guiding the splicing tape to crawl on the path forming section, and configured to transfer the drum-shaped collecting section, the feeder set unit may include a splicing section configured to splice a distal end of the splicing tape and a distal end of the peeled cover tape, and the control device may cause the collecting section set unit so as to attach the splicing tape and the collecting section to the feeder set in the feeder set unit, and may control the feeder set unit so that the splicing section splices the distal end of the splicing tape and the distal end of the cover tape, after the splicing tape is crawled on the path forming section in advance in the collecting section set unit. Accordingly, in a feeder of a type using the drum-shaped collecting section, it is possible to efficiently attach the reel and the collecting section.

In the reel installation and removal device of the present disclosure, the control device may execute an attachment control of attaching the reel to the feeder in a state where the feeder from which the reel is detached is set in the feeder set unit, driving the holding section and the rotation section so that a distal end of the tape is fed from the reel to the feeding section, and controlling the feeder set unit and the reel transfer unit so that the feeding section is driven until the distal end of the tape reaches a predetermined position. Accordingly, since the detachment and the attachment of the reels can be performed by a common installation and removal device, the installation and removal device can be configured to be compact.

In the reel installation and removal device of the present disclosure, the feeder may include an opening and closing cover that exposes the reel in an opened state to be installed and removed, the device further includes a cover opening and closing unit configured to open and close the opening and closing cover of the feeder set in the feeder set unit, and to hold the opening and closing cover in the opened state at a position not interfering with a relative movement of other units to the feeder set unit. Accordingly, the installation and removal of the reel can be further efficiently performed.

It is a gist that another reel installation and removal device of the present disclosure is a reel installation and removal device that installs and removes a reel on which a tape accommodating a component is wound to and from a feeder which feeds the tape by driving of a feeding section and supplies the component, the device including a feeder set unit on which the feeder is set, a holding section configured to hold the tape of the reel mounted on the feeder, a cutting section configured to cut the tape, and a control device configured to drive the holding section and the cutting section so that the tape is held and cut at a portion to which the component has been supplied, in a state where the feeder to which the reel is attached is set in the feeder set unit. Even in this manner, since it is possible to prevent the component from being affected by the distal end process of the tape when the reel is attached next time by cutting the tape at the portion to which the component has been supplied, it is possible to more appropriately detach the reel in a case where the installation and removal of the reel is automatically performed.

It is a gist that a feeder preparation system of the present disclosure includes any of the reel installation and removal devices described above, a feeder preparation device configured to transfer the feeder between a feeder storage section storing multiple feeders and the feeder set unit, and to prepare the feeder as an installation and removal target of the reel, a reel set base on which the reel is set so that the reel transfer unit is transferred, and a reel preparation device configured to transfer the reel between a reel storage section storing multiple reels and the reel set base, and to prepare the reel as an installation and removal target to the feeder.

In the feeder preparation system of the present disclosure, since the reel is automatically installed and removed to and from the feeder by any of the reel installation and removal devices described above, it is possible to more appropriately detach the reel. In addition, since the preparation of the feeder and the preparation of the reel can also be automatically performed, the automatic installation and removal of the reel can be further efficiently performed.

INDUSTRIAL APPLICABILITY

The present disclosure can be used in the manufacturing industry of component mounting systems and the like.

REFERENCE SIGNS LIST 1 component mounting system, 2 management device, 4 AGV, 10 mounting line, 12 printing device, 14 printing inspection device, 16 mounting device, 18 feeder storage location, 19 loader, 20 preparation line, 22 automatic reel storage, 22a cradle, 24 reel transfer robot, 25 reel storage location, 26 feeder storage, 28 feeder storage location, 29 loader, 30 reel installation and removal device, 31 base plate, 32 upper plate, 32a opening, 33, 34 slide unit, 35 reel set base, 36 base, 37 support pin, 39 control device, 39a CPU, 39b ROM, 39c RAM, 40 feeder set unit, 40a base, 42 guide opening and closing section, 44 tape drawing section, 46 tape splicing section, 47 fixed clamp section, 47a, 47b, 48a, 48b clamp member, 47c, 48c clamp cylinder, 48 moving clamp section, 49 slide section, 49a slide block, 49b slide cylinder, 50 cover opening and closing unit, 50a base, 52 support column, 53 pivot plate, 54 pickup platen, 55 motor, 56 pulley, 60 reel transfer unit, 60a slide base, 61 support pin, 61a expanding cylinder, 62 motor, 63 push-in plate, 63a push-in cylinder, 64 chuck, 64a chuck cylinder, 65 guide pin, 66 cutter, 66a cutter cylinder, 67 push-turning disc, 68 buffer member, 70 drum set unit, 71 fixed unit, 71a fixed base, 72 Y-axis slider, 73 motor, 74 pulley, 75 Z-axis slider, 76 motor, 77 pulley, 78 chuck, 78a chuck cylinder, 81 moving unit, 81a slide base, 82 rotary transfer disc, 82a support shaft, 82b long hole, 83 motor, 84 drum chuck, 84a chuck cylinder, 85 guide pin, 85a pin cylinder, 86 tape chuck, 86a chuck cylinder, 87 motor, 88 pulley, 90 tape cutting unit, 90a base, 91 cutting base, 92 tape feeding section, 93 sprocket, 94 motor, 95 first tape cutter, 95a, 96a, 97a cutter cylinder, 96 second tape cutter, 97 third tape cutter, 98 slider, 100 feeder, 101 main body, 102 tape feeding section, 103 motor, 104 tape guide, 106 reel cover, 108 connector, 109 positioning pin, 110 tape collecting section, 111 drum shaft, 113 guide pin, 115 collecting drum, 115*a* drum main body, 116 splicing tape, 117 fixing piece, 118 loop, 119 slide piece, 120 reel, 122 label, 130 tape, 132 bottom tape, 134 cover tape

The invention claimed is:

1. A reel installation and removal device that installs and removes a reel on which a tape accommodating a component is wound to and from a feeder which feeds the tape by driving of a feeding section and supplies the component, the device comprising:
  a feeder set unit on which the feeder is set so that the feeding section is driven;
  a reel transfer unit including a rotation section rotating the reel around a shaft, and configured to move relative to the feeder set unit to transfer the reel;
  a holding section configured to hold the tape of the reel mounted on the feeder;
  a cutting section configured to cut the tape; and
  a control device configured to execute a detachment control of driving the holding section and the cutting section so that the tape is held and cut in a portion to which the component has been supplied after driving the feeding section and the rotation section so that the tape is rewound and to be wound around the reel, and controlling the feeder set unit and the reel transfer unit so as to detach the reel from the feeder, in a state where the feeder to which the reel is attached is set in the feeder set unit.

2. The reel installation and removal device according to claim 1, wherein
  the tape includes a bottom tape accommodating the component and a cover tape covering the component, and is capable of supplying the component by peeling off the cover tape,
  the feeder includes multiple types of feeders including a type having a drum-shaped collecting section collecting the cover tape while winding the cover tape together with a splicing tape to which a distal end is spliced to the cover tape and a type in which the cover tape is pulled and collected to a collecting section different from the drum-shaped collecting section, and
  the control device drives the feeding section and the rotation section to rewind the cover tape by reserving a length adaptable for any type when the reel is attached to the feeder next time in the detachment control.

3. The reel installation and removal device according to claim 2, wherein
  the feeder is provided with a guide path guiding the cover tape to the drum-shaped collecting section,
  the device further comprises a collecting section set unit configured to be moved relative to the feeder set unit, including a path forming section forming a path along the guide path and a guide section guiding the splicing tape on the path forming section, and configured to transfer the drum-shaped collecting section,
  the feeder set unit includes a splicing section configured to splice a distal end of the splicing tape and a distal end of the peeled cover tape, and
  the control device causes the collecting section set unit so as to attach the splicing tape and the drum-shaped collecting section to the feeder set in the feeder set unit, and controls the feeder set unit so that the splicing section splices the distal end of the splicing tape and the distal end of the cover tape, after the splicing tape is guided on the path forming section in advance in the collecting section set unit.

4. The reel installation and removal device according to claim 1, wherein
  the control device executes an attachment control of attaching the reel to the feeder in a state where the feeder from which the reel is detached is set in the feeder set unit, driving the holding section and the rotation section so that a distal end of the tape is fed from the reel to the feeding section, and controlling the feeder set unit and the reel transfer unit so that the feeding section is driven until the distal end of the tape reaches a predetermined position.

5. The reel installation and removal device according to claim 1, wherein
  the feeder includes an opening and closing cover that exposes the reel in an opened state to be installed and removed,
  the device further comprises a cover opening and closing unit configured to open and close the opening and closing cover of the feeder set in the feeder set unit, and to hold the opening and closing cover in the opened state at a position not interfering with a relative movement of other units to the feeder set unit.

6. A feeder preparation system comprising:
  the reel installation and removal device according to claim 1;
  a reel set base on which the reel is set so that the reel transfer unit is transferred; and
  a reel preparation device configured to transfer the reel between a reel storage section storing multiple reels and the reel set base, and to prepare the reel as an installation and removal target to the feeder.

7. A reel installation and removal device that installs and removes a reel on which a tape accommodating a component is wound to and from a feeder which feeds the tape by driving of a feeding section and supplies the component, the device comprising:
  a feeder set unit on which the feeder is set;
  a holding section configured to hold the tape of the reel mounted on the feeder;
  a cutting section configured to cut the tape; and
  a control device configured to drive the holding section and the cutting section so that the tape is held and cut at a portion to which the component has been supplied, in a state where the feeder to which the reel is attached is set in the feeder set unit.

* * * * *